United States Patent
Hung et al.

(10) Patent No.: US 12,205,672 B2
(45) Date of Patent: Jan. 21, 2025

(54) MANAGING REFERENCE CURRENTS IN SEMICONDUCTOR DEVICES

(71) Applicant: Macronix International Co., Ltd., Hsinchu (TW)

(72) Inventors: Chun-Hsiung Hung, Hsinchu (TW); Fu-Nian Liang, New Taipei (TW); Shang-Chi Yang, Changhua County (TW)

(73) Assignee: Macronix International Co., Ltd., Hsinchu (TW)

(*) Notice: Subject to any disclaimer, the term of this patent is extended or adjusted under 35 U.S.C. 154(b) by 205 days.

(21) Appl. No.: 18/075,799

(22) Filed: Dec. 6, 2022

(65) Prior Publication Data
US 2024/0185899 A1  Jun. 6, 2024

(51) Int. Cl.
*G11C 7/14* (2006.01)
*G11C 7/06* (2006.01)
*G11C 7/10* (2006.01)

(52) U.S. Cl.
CPC .......... *G11C 7/14* (2013.01); *G11C 7/067* (2013.01); *G11C 7/1069* (2013.01)

(58) Field of Classification Search
CPC ......... G11C 7/14; G11C 7/067; G11C 7/1069; G11C 7/062; G11C 16/28
See application file for complete search history.

(56) References Cited

U.S. PATENT DOCUMENTS

| | | |
|---|---|---|
| 2001/0033514 A1 | 10/2001 | Takata et al. |
| 2003/0169622 A1 | 9/2003 | Ooishi et al. |
| 2004/0008543 A1 | 1/2004 | Kato |
| 2004/0196696 A1 | 10/2004 | Yamauchi |
| 2006/0126387 A1* | 6/2006 | Kim .............. G11C 11/5642 365/185.17 |
| 2009/0164710 A1 | 6/2009 | Choi et al. |
| 2011/0267893 A1* | 11/2011 | Kato .............. G11C 16/28 365/185.22 |
| 2013/0215687 A1 | 8/2013 | Chen et al. |
| 2015/0085593 A1* | 3/2015 | Mu .............. G11C 7/14 365/208 |

(Continued)

FOREIGN PATENT DOCUMENTS

TW  200945348 A1  11/2009
TW  201340107 A   10/2013

*Primary Examiner* — Jay W. Radke
(74) *Attorney, Agent, or Firm* — Fish & Richardson P.C.

(57) ABSTRACT

Systems, devices, methods, and circuits for managing reference currents in semiconductor devices. In one aspect, a semiconductor device includes: a memory cell array configured to store data in sets of memory cells and circuitry coupled to the memory cell array. Each set of one or more sets of memory cells in the memory cell array is associated with a respective reference current, and memory cells in sets associated with different reference currents have different threshold voltage distributions. The circuitry is configured to: determine information associated with a reference current for a set of memory cells in the memory cell array based on a memory address corresponding to the set, generate the reference current based on the information associated with the reference current for the set, and sense one or more memory cells in the set based on the reference current.

22 Claims, 8 Drawing Sheets

(56) References Cited

U.S. PATENT DOCUMENTS

| | | | |
|---|---|---|---|
| 2015/0160677 A1* | 6/2015 | Furuta | G05F 3/24 |
| | | | 323/317 |
| 2015/0270006 A1* | 9/2015 | Yoo | G11C 7/04 |
| | | | 365/185.21 |
| 2018/0047453 A1* | 2/2018 | Zhang | G11C 5/025 |
| 2019/0252019 A1* | 8/2019 | Aoki | G11C 13/003 |
| 2021/0241829 A1 | 8/2021 | Islam | |

* cited by examiner

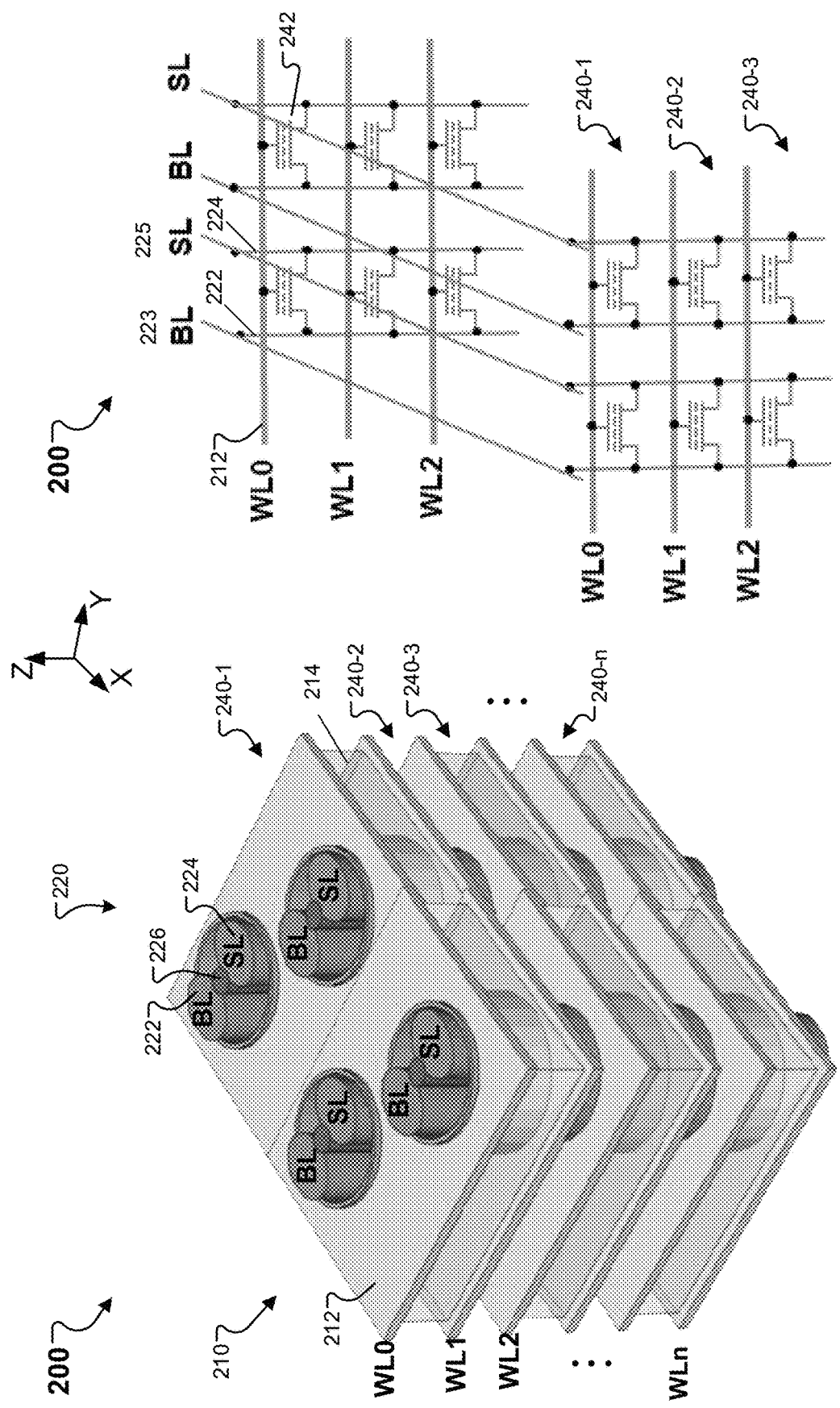

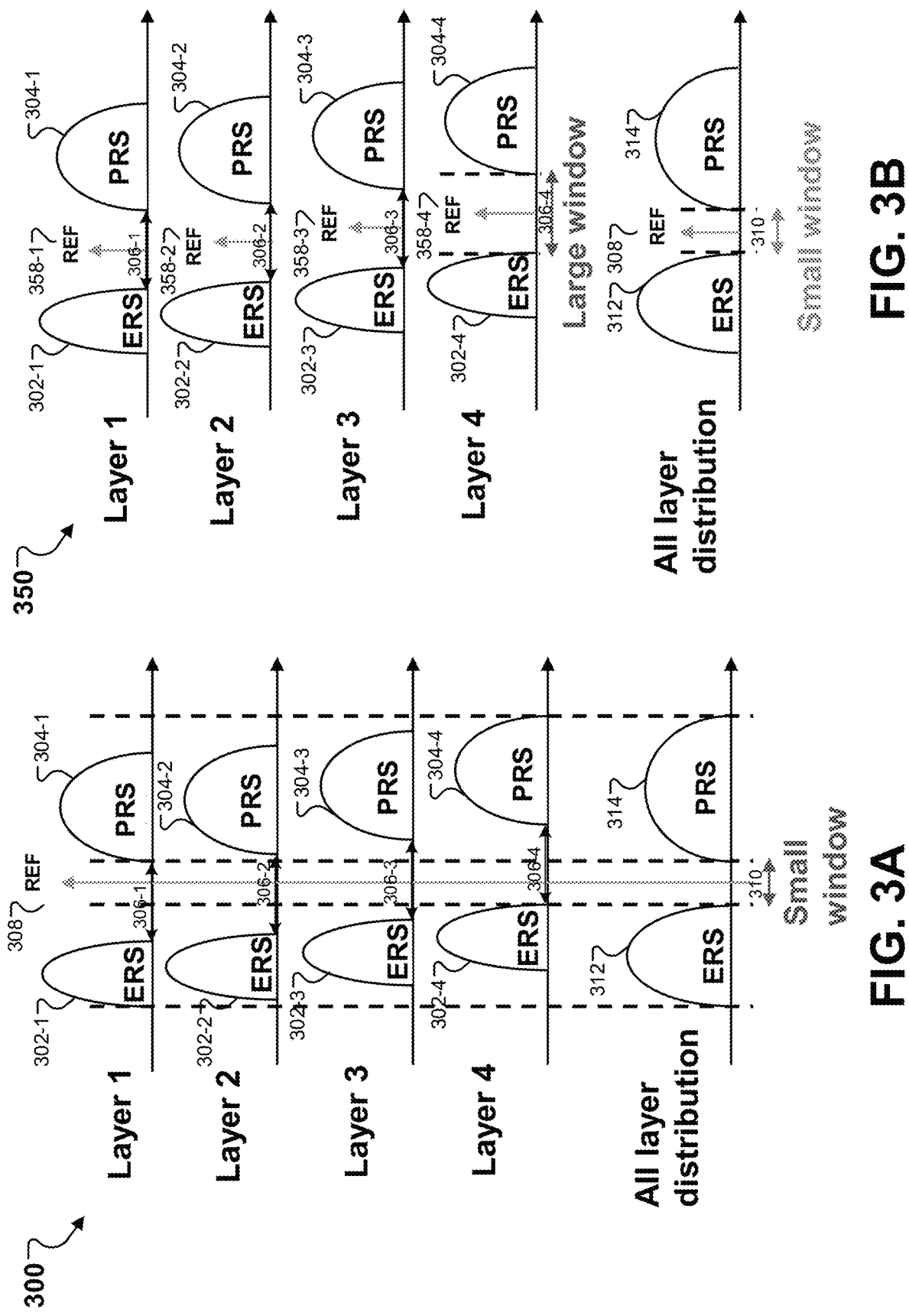

ns in SEMICONDUCTOR DEVICES

BACKGROUND

Semiconductor devices, e.g., high-density flash memory devices, can have various structures to increase a density of memory cells and lines on a chip. For example, three-dimensional (3 D) memory devices have been explored to achieve increased memory cell densities with competitive cost. However, in the 3 D memory devices, there may be variations in characteristics of different layers, which can affect the performance of the memory devices.

SUMMARY

The present disclosure describes methods, devices, systems, and techniques for managing reference currents in semiconductor devices, e.g., non-volatile flash memory devices. For example, in the following sections, the disclosed techniques are described primarily with respect to three-dimensional (3 D) non-volatile memory devices, such as 3 D NOR flash memory devices.

One aspect of the present disclosure features a semiconductor device, including: a memory cell array configured to store data in sets of memory cells and circuitry coupled to the memory cell array. Each set of one or more sets of memory cells in the memory cell array is associated with a respective reference current, and memory cells in sets associated with different reference currents have different threshold voltage distributions. The circuitry is configured to: determine information associated with a reference current for a set of memory cells in the memory cell array based on address information of the set, generate the reference current based on the information associated with the reference current for the set, and sense one or more memory cells in the set based on the reference current.

In some implementations, the address information of the set includes at least one of: an identifier of the set among the sets of memory cells in the memory cell array, or a memory address corresponding to the set.

In some implementations, the circuitry is configured to: provide a sensing current to a memory cell in the set: and sense the memory cell in the set based on the sensing current and the reference current.

In some implementations, the circuitry is configured to sense the memory cell in the set based on a comparison of the sensing current and the reference current.

In some implementations, the circuitry includes a sensing transistor coupled to a bit line voltage generator and configured to receive a bit line clamping voltage from the bit line voltage generator, and the sensing current is generated based on the bit line clamping voltage and flows through the sensing transistor.

In some implementations, the circuitry includes a reference current circuit coupled to a reference voltage generator and configured to receive a reference voltage from the reference voltage generator. The reference current can be generated based on the reference voltage.

In some implementations, the circuitry further includes a sensing circuit having a reference node coupled to the reference current circuit and a sensing node coupled to the memory cell array. The reference current circuit includes a first node coupled to the reference node of the sensing circuit, a second node coupled to a ground, and a third node coupled to the reference voltage generator. The reference current flows from the sensing circuit through the reference current circuit to the ground when the third node of the reference current circuit receives the reference voltage from the reference voltage generator.

In some implementations, the circuitry includes a sense amplifier including the sensing circuit, and the sensing circuit includes a comparator.

In some implementations, the reference current circuit includes a transistor having a first terminal as the first node, a second terminal as the second node, and a gate terminal as the third node, the reference voltage generator is configured to generate the reference voltage based on the information associated with the reference current, and the reference current is generated based on the reference voltage and flows through the transistor.

In some implementations, the reference current circuit includes a plurality of reference current sub-circuits that are coupled in parallel between the sensing circuit and the ground, and each of the plurality of reference current sub-circuits is configured to generate a corresponding reference current based on the reference voltage, corresponding reference currents generated by the plurality of reference current sub-circuits being different from each other.

In some implementations, one of the plurality of reference current sub-circuits is configured to be turned on based on the information associated with the reference current for the set and to generate the reference current based on the reference voltage, the reference current flowing through the one of the plurality of reference current sub-circuits.

In some implementations, one or more other sub-circuits of the plurality of reference current sub-circuits are configured to be turned off based on the information associated with the reference current for the set, and no reference current flows through the one or more other sub-circuits when the one of the plurality of reference current sub-circuits is turned on.

In some implementations, each of the plurality of reference current sub-circuits includes: a switching transistor configured to be switched on or off based on a control signal; and a reference transistor coupled to the reference voltage generator and configured to receive the reference voltage from the reference voltage generator. The switching transistor and the reference transistor can be coupled in series between the sensing circuit and the ground. Each of the plurality of reference current sub-circuits can be configured to: be turned on to generate the corresponding reference current if the switching transistor is switched on, and be turned off if the switching transistor is switched off.

In some implementations, the information associated with the reference current for the set includes an option code having respective values for the plurality of reference current sub-circuits. The circuitry can be configured to generate corresponding control signals for the switching transistors in the plurality of reference current sub-circuits based on the respective values of the option code, the corresponding control signals being configured to turn on one of the plurality of reference current sub-circuits and to turn off one or more other ones of the plurality of reference current sub-circuits.

In some implementations, each reference current is associated with a respective group of sets in the memory cell array, and threshold voltage distributions of memory cells in sets of a same group are within a predetermined range.

In some implementations, the semiconductor device further includes a register configured to store associations between the one or more sets and one or more reference currents associated with the one or more sets. The register can be stored in at least one of the memory cell array or in the circuitry.

In some implementations, the semiconductor device is configured to be a three-dimensional (3 D) NOR flash memory, and a set of memory cells in the semiconductor device is a memory cell layer of memory cells.

Another aspect of the present disclosure features a system, including: a semiconductor device and a controller coupled to the semiconductor device. The semiconductor device includes: a memory cell array configured to store data in sets of memory cells and circuitry coupled to the memory cell array. Each set of one or more sets of memory cells in the memory cell array is associated with a respective reference current, and memory cells in sets associated with different reference currents have different threshold voltage distributions. The controller is configured to send a read command to the semiconductor device, the read command including address information of a set of memory cells in the memory cell array. The circuitry of the semiconductor device is configured to: determine information associated with a reference current for the set of memory cells in the memory cell array based on the address information of the set in the read command, generate the reference current based on the information associated with the reference current for the set, sense one or more memory cells in the set based on the reference current: and send a sensing result of the one or more memory cells in the set to the controller.

In some implementations, the circuitry of the semiconductor device includes a sense amplifier coupled to the memory cell array. The sense amplifier can include: a reference current circuit coupled to a reference voltage generator and configured to receive a reference voltage from the reference voltage generator, and a sensing circuit having a reference node coupled to the reference current circuit and a sensing node coupled to the memory cell array. The reference current circuit can include a first node coupled to the reference node of the sensing circuit, a second node coupled to a ground, and a third node coupled to the reference voltage generator. The reference current can flow from the sensing circuit through the reference current circuit to the ground when the third node of the reference current circuit receives the reference voltage from the reference voltage generator.

In some implementations, the reference current circuit includes a transistor having a first terminal as the first node, a second terminal as the second node, and a gate terminal as the third node. The reference voltage generator can be configured to generate the reference voltage based on the information associated with the reference current. The reference current can be generated based on the reference voltage and flows through the transistor.

In some implementations, the reference current circuit includes a plurality of reference current sub-circuits that are coupled in parallel between the sensing circuit and the ground. Each of the plurality of reference current sub-circuits can be configured to generate a corresponding reference current based on the reference voltage, corresponding reference currents generated by the plurality of reference current sub-circuits being different from each other. The circuitry can be configured to turn on one of the plurality of reference current sub-circuits and to turn off one or more other sub-circuits of the plurality of reference current sub-circuits based on the information associated with the reference current for the set, the reference current flowing through the one of the plurality of reference current sub-circuits and no reference current flowing through the one or more other sub-circuits of the plurality of reference current sub-circuits.

In some implementations, the information associated with the reference current for the set includes an option code having respective values for the plurality of reference current sub-circuits, and the circuitry is configured to generate corresponding control signals for the plurality of reference current sub-circuits based on the respective values of the option code, the corresponding control signals being configured to turn on the one of the plurality of reference current sub-circuits and to turn off the one or more other ones of the plurality of reference current sub-circuits.

In some implementations, each reference current is associated with a respective group of sets in the memory cell array, and threshold voltage distributions of memory cells in sets of a same group are within a predetermined range. The semiconductor device can further include a register configured to store associations between reference currents and respective groups of sets.

A further aspect of the present disclosure features a method, including: determining information associated with a reference current for a set of memory cells in a semiconductor device based on address information of the set, where each set of one or more sets of memory cells in the semiconductor device is associated with a respective reference current, and memory cells in sets associated with different reference currents have different threshold voltage distributions: generating the reference current based on the information associated with the reference current for the set: and sensing one or more memory cells in the set based on the reference current.

Implementations of the above techniques include methods, systems, circuits, computer program products and computer-readable media. In one example, a method can include the above-described actions. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 2A is a perspective view of an example three-dimensional (3 D) memory device.

FIG. 2B is a schematic diagram of the 3 D memory device of FIG. 2A.

FIG. 3A illustrates example threshold voltage distributions of different layers in a 3 D memory device with a same read reference voltage.

FIG. 3B illustrates example threshold voltage distributions of different layers in a 3 D memory device with corresponding read reference voltages.

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
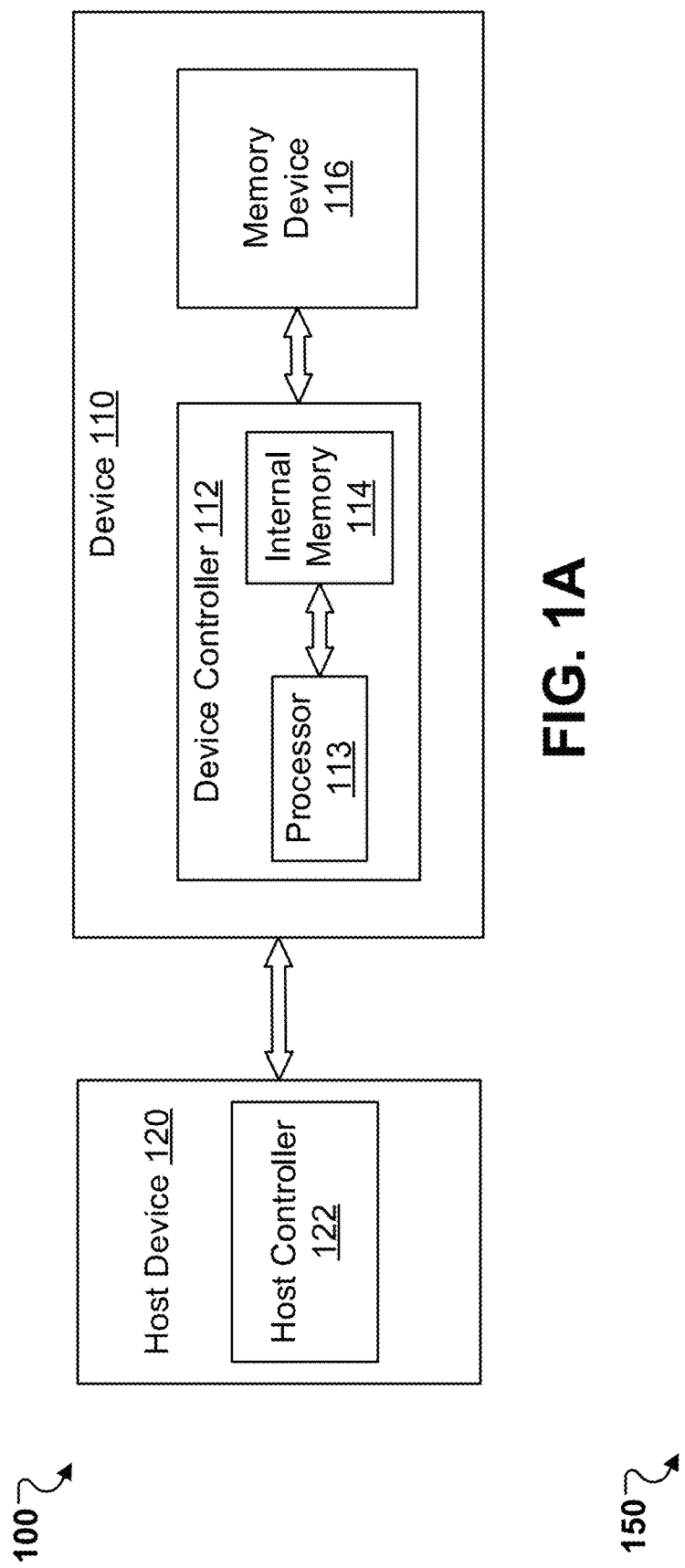
FIG. 1A is a schematic diagram illustrating an example of a system including a memory device.

In three-dimensional (3 D) semiconductor architecture (e.g., 3 D memory devices), variations in characteristics of layers of memory cells, e.g., due to fabrication and/or process issues, can cause threshold voltage distributions of the memory cells in different layers (e.g., in a block) differ from each other. Thus, a sensing window for sensing the different layers with a same read current or voltage can be narrow, which can decrease a sensing yield of the 3 D architecture.

Implementations of the present disclosure provide techniques for managing reference currents in memory devices, by, for example, adjusting reference currents for layers with different characteristics in the memory devices to compensate for the variations of the layers. For example, each layer can have a respective sensing window for sensing memory cells in the layer with a respective read current or voltage. Accordingly, the respective sensing windows for the layers can be greater than the same sensing window that would otherwise be used for the layers, which can lead to an improvement in a performance (e.g., a sensing performance) of the memory devices and a sensing yield of the memory devices.

In some implementations, characteristics of layers in a 3 D memory device, e.g., threshold voltage distributions of memory cells in the layers, can be first determined, e.g., by measuring and/or testing the memory cells in the layers. Based on the characteristics of the layers, the layers can be categorized into different groups. Threshold voltage distributions of memory cells in layers of a same group can be substantially same or within a predetermined range. Memory cells in layers of different groups can have different threshold voltage distributions. For each group, a respective reference current can be determined for sensing memory cells in layers in the group. Different groups can be associated with different reference currents (e.g., I1 for Group 1, I2 for Group 2, . . . , In for Group n). In some examples, the reference currents can be calculated based on a base reference current $I_0$, e.g., $0.9*I_0$, $1*I_0$, $1.1*I_0$, $1.2*I_0$. In some cases, associations between group information and information of respective reference currents can be stored in the 3 D memory device, e.g., in a table or a register. The group information of each group can include address information of layers in the group. Thus, each layer in the 3 D memory device can be associated with a corresponding reference current.

Address information of a layer can include an identifier of the layer (e.g., layer number and block number) or a memory address (e.g., a starting address) in the 3 D memory device. Information of a reference current can include an option code having respective values for the different layers or different groups. For example, layers in the 3 D memory devices can be categorized in four groups 3, 2, 1, 0), and an option code for layers in Group 3, Group 2, Group 1, Group 0 can be [1 0 0 0], [0 1 0 0], [0 0 1 0], and [0 0 0 1], respectively. That is, when a layer in one group is identified, the layer in the group is provided with a corresponding reference current for the group, while there is no reference current to be provided to layers in the other three groups.

In some implementations, according to address information, e.g., in a read command from a controller, a layer in a 3 D memory device can be identified. Then, based on stored associations between the layer or a group including the layer and information of a corresponding reference current, the information of the corresponding reference current can be identified or determined. Based on the information of the corresponding reference current, the 3 D memory device can generate the corresponding reference current and use the generated corresponding reference current to sense memory cells in the layer.

The 3 D memory device can include a sense amplifier for sensing memory cells in the layer based on a reference current and a sensing current to a memory cell array. The sense amplifier can include a sensing circuit (e.g., a comparator) having a reference node coupled to a reference current circuit where the reference current flows and a sensing node coupled to the memory cell array (e.g., through a sensing transistor coupled to a bit line voltage generator) where the sensing current flows. The reference current circuit can be coupled to a ground.

In some implementations, the reference current circuit includes a transistor coupled between the reference node of the sensing circuit and the ground. The transistor is configured to receive a reference voltage from a reference voltage generator. The reference voltage generator can be configured to generate a corresponding reference voltage based on the information of a corresponding reference current associated with an identified layer. e.g., an option code. Accordingly, the corresponding reference current can be generated based on the corresponding reference voltage generated by the reference voltage generator.

In some implementations, the reference current circuit includes a plurality of reference current sub-circuits coupled in parallel with the reference node of the sensing circuit and the ground. Each reference current sub-circuit corresponds to a respective group and is configured to generate a corresponding reference current for layers in the respective group. The option code for an identified layer can be used to generate corresponding control signals (e.g., different voltage signals) to control the plurality of reference current sub-circuits. e.g., to turn on a corresponding reference current sub-circuit to generate the corresponding reference current for the identified layer and to turn off the other reference current sub-circuits so that no reference current flows in the other reference current sub-circuits. In such a way, layers in different groups (or with different characteristics) can be provided with different reference currents. e.g., for sensing or read operations.

The techniques can be applied to circuits, devices, or systems that may need adjustable currents (e.g., reference currents in a sensing scheme) to compensate variations (e.g., process and temperature variations) among different components (e.g., different memory layers or circuits). The techniques can be applied to different dimensions of memory devices. e.g., two-dimensional (2 D) memory devices or three-dimensional (3 D) memory devices. The techniques can be applied to various types of volatile memory devices or non-volatile memory (NVM) devices, such as NOR flash memory. NAND flash memory. Static Random Access Memory (SRAM), Dynamic Random Access Memory (DRAM), resistive random-access memory (RRAM), phase-change memory (PCM) such as phase-change random-access memory (PCRAM), spin-transfer torque (STT)-Magnetoresistive random-access memory (MRAM), among others. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), or solid-state drives (SSDs), embedded systems, computing network devices such as network routers or network processors, cache controllers and translation lookaside buffers, lookup tables, database engines, data compression hardware, artificial neural networks, intrusion prevention systems, custom computer, among others.

Example Systems and Devices

FIG. 1A is a schematic diagram illustrating an example of a system 100 including a memory device. The system 100 includes a device 110 and a host device 120. The host device 120 includes a host controller 122 that can include at least one processor and at least one memory coupled to the at least one processor and storing programming instructions for execution by the at least one processor to perform one or more corresponding operations. The device 110 includes a device controller 112 and a memory device 116. The device controller 112 includes a processor 113 and an internal memory 114. In some implementations, the device 110 includes a plurality of memory devices 116 that are coupled to the device controller 112. The memory device 116 includes a plurality of blocks. The memory device 116 can be a two-dimensional (2 D) memory including 2 D memory blocks. The memory device 116 can also be a three-dimensional (3 D) memory including 3 D memory blocks.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to the host device 120. For example, the device 110 is an SD card in a digital camera or a media player that is the host device 120.

The device controller 112 can be a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime. The device controller 112 transfers the instruction code and/or the data from the memory device 116 to the internal memory 114.

In some implementations, the memory device 116 is a non-volatile memory that is configured for long-term storage of instructions and/or data, e.g., an NOR flash memory device (e.g., as illustrated in FIGS. 2A-2B), or some other suitable non-volatile memory device. The memory device 116 can include one or more memory chips. In some implementations where the memory device 116 is an NOR flash memory, the device 110 can optionally include the device controller 112. In some cases, the device 110 can include no device controller and the memory device 116 can directly communicate with the host device 120.

Figure 1B:
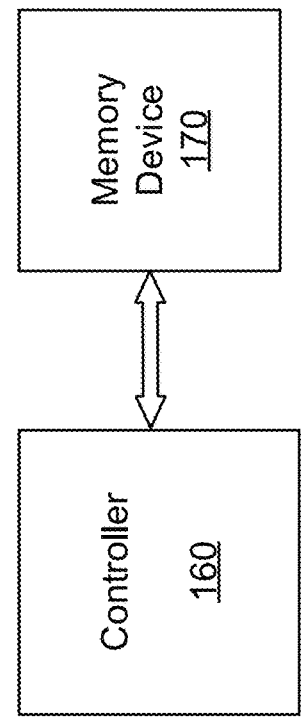
FIG. 1B is a schematic diagram illustrating another example of a system including a controller and a memory device.

FIG. 1B is a schematic diagram illustrating another example of a system 150 including a controller 160 and a memory device 170, according to one or more embodiments of the present disclosure. The controller 160 is coupled to the memory device 170 via an electrical connection, e.g., an electrical wire, pin or bus, or a wireless connection, and communicates, e.g., directly, with the memory device 170. The controller 160 can be the host controller 122 of FIG. 1A or the device controller 112 of FIG. 1A. The memory device 170 can be the memory device 116 of FIG. 1A and be implemented as a non-volatile NOR memory device that can have a 2 D or 3 D architecture.

Example 3 D Memory Devices

FIG. 2A is a perspective view of an example three-dimensional (3 D) memory device 200. FIG. 2B is a schematic diagram of the 3 D memory device 200 of FIG. 2A. The memory device 200 can be the memory device 116 of FIG. 1A or the memory device 170 of FIG. 1B. For illustration purposes, a 3 D NOR memory device is described herein as an example of the 3 D memory device 200.

The 3 D memory device 200 includes a memory cell array 210 that can be formed on or in a semiconductor substrate. The semiconductor substrate can include one or any combination of silicon, doped silicon, germanium, silicon germanium, semiconductor compounds, or other semiconductor materials. The memory cell array 210 can include multiple memory cell layers 240-1, 240-2, 240-3, . . . , 240-$n$ (referred to generally as memory cell layers 240 and individually as memory cell layer 240). Each memory cell layer 240 can include a number of memory cells 242, e.g., along XY plane. Each memory cell 242 can be a transistor, e.g., MOS transistor, having a gate terminal, a source terminal, and a drain terminal.

The memory cell array 210 includes multiple alternating pairs of conductive layers 212 and insulating layers 214 extending along a vertical direction, e.g., Z direction. The conductive layers can form word lines (WLs), e.g., WL0, WL1, . . . , WLn, that are electrically coupled to memory cells 242 in a corresponding memory cell layer 240. The insulating layers 214 can be made of a dielectric material, e.g., silicon oxide (OX). The conductive layers 212 can be made of a conductive material, e.g., a metal such as Tungsten (W).

The memory cell array 210 includes a number of vertical channels (VCs) (or channel pillars) 220. Each VC 220 includes a plurality of memory cells 242 conductively connected along the vertical direction, and is coupled to a corresponding bit line (BL) 222 and a corresponding source line (SL) 224 that can be separated by an insulating material 226. Each memory cell 242 in the VC 220 is coupled to the corresponding BL 222 at the drain terminal and the corresponding SL 224 at the source terminal. Multiple bit lines 222 can be conductively coupled to a same metal line 223 (e.g., on top of the memory cell layers 240), and multiple source lines 224 can be conductively coupled to a same metal line 225 (e.g., on top of the memory cell layers 240). The metal lines 223 and 225 can be in a metal layer on top of the memory cell arrays 240 and insulated from each other. In some implementations, the VCs 220 is conductively coupled to a driving circuit layer (e.g., CuA layer), and the driving circuit layer can include a plurality of active devices, such as transistors and a number of conducive lines that are electrically coupled to word line layers 212, e.g., WL0, WL1, WL2, . . . , WLn.

The VCs 220 penetrates downwards through multiple alternating pairs of conductive layers 212 (word line layer) and insulating layers 214. An external surface of the VC 220 contact the conductive layers 212, which act as gate terminals of the memory cells 242. The VC 220s can include multiple layers that can include a tunneling layer, a charge trapping layer, and a blocking layer. The tunneling layer can include a silicon oxide, or a silicon oxide/silicon nitride combination (e.g. Oxide/Nitride/Oxide or ONO). The charge trapping layer can include silicon nitride (SiN) or other materials capable of trapping charges. The blocking layer can include silicon oxide, aluminum oxide, and/or combinations of such materials. The multiple layers can be formed on an internal surface of the VC 220, and polysilicon can be filled in a middle of the VC 220. The filled materials (e.g., the multiple layers and polysilicon) in each VC 220 intersecting the conductive layers 212 can form a plurality of memory cells 242 along the vertical direction such as Z direction.

As noted above, in a 3 D architecture such as the 3 D memory device 200, when a number of memory cell layers 240 is large (e.g., along Z direction), e.g., more than one hundred, there may exist variations (e.g., structure variations due to fabrication or process) among the different memory cell layers 240. For example, memory cells in a lower memory cell layer (e.g., 240)-n) close to the substrate can have a larger size than memory cells 242 in a higher memory cell layer (e.g., 240-0)) close to a top of the memory cell array 210. The variations of the memory cell layers 240 can cause characteristic variations (e.g., threshold voltage distributions) of memory cells in the memory cell layers 240.

A memory cell can represent a number of states including an erased state (ERS) and one or more programmed states (PRS). For example, in some cases, the memory cell is a single-level cell (SLC) that can store 1 bit and represent 2 states including an erased state (ERS) and a programmed state (A). Memory cells conductively connected to one word line can form one page or layer. In some cases, the memory cell is a multi-level cell (MLC) such as a 2-level cell that can store 2 bits and represent 4 states including an erased state (ER) and three programmed states (A, B, and C). Memory cells conductively connected to one word line can form two pages or layers. In some cases, the memory cell is a triple-level cell (TLC) that can store 3 bits and represent 8 states including an erased state (ER) and seven programmed states (A, B, C, D, E, F, and G). Memory cells conductively connected to one word line can form three pages or layers.

Each state corresponds to a distribution of threshold voltages in a range between a lower limit voltage and a higher limit voltage. A memory cell having a threshold voltage within the range is considered to be in the corresponding state. In other words, a memory cell being in a state has a threshold voltage within the range. The states can have progressively higher voltage ranges, and the erased state can have a lower voltage range (or threshold voltage distribution) than a programmed state. During a read operation, a read voltage can be applied to a word line coupled to a gate of a selected memory cell to determine whether the selected memory cell is a turned-on or turned-off state. When a read voltage in a sensing window that is between the higher limit voltage of an erased state (ERS) and the lower limit voltage of a programmed state (PRS) is applied, the memory cell is turned on when it has the state ERS and turned off when it has the programmed state PRS. A read reference voltage can be determined as a middle voltage in the sensing window and used as a reference for choosing the read voltage. Thus, variations of the threshold voltage distributions (or the voltage ranges) of memory cells can affect sensing results of the memory cells. For illustration purposes, SLC is described as an example of a memory cell in the following descriptions.

Example Sensing Windows

FIG. 3A illustrates an example 300 of threshold voltage distributions of different layers in a 3 D memory device with a same read reference voltage in a sensing window. The 3 D memory device can be the 3 D memory device 200 of FIGS. 2A-2B. The layers, e.g., Layer 1, Layer 2, Layer 3, and Layer 4, can be the memory cell layers 240 of FIGS. 2A-2B. Memory cells in the layers can be the memory cells 242 of FIG. 2B. The memory cells can be SLC that includes an erased state (ERS) and a programmed state (PRS). Each state has a corresponding threshold voltage distribution or range defined by a lower limit voltage and a higher limit voltage.

As noted above, variations of memory cell layers can cause different threshold voltage distributions of memory cells in the memory cell layers. For example, as illustrated in FIG. 3A, memory cells in Layer 1 has an erased state (ERS) with a threshold voltage distribution 302-1 and a programmed state (PRS) with a threshold voltage distribution 304-1, thus, the memory cells can be accurately sensed by a read voltage in a sensing window 306-1. Similarly, memory cells in Layer 2 has an erased state (ERS) with a threshold voltage distribution 302-2 and a programmed state (PRS) with a threshold voltage distribution 304-2, thus, the memory cells can be accurately sensed by a read voltage in a sensing window 306-2. Memory cells in Layer 3 has an erased state (ERS) with a threshold voltage distribution 302-3 and a programmed state (PRS) with a threshold voltage distribution 304-3, thus, the memory cells can be accurately sensed by a read voltage in a sensing window 306-3. Memory cells in Layer 4 has an erased state (ERS) with a threshold voltage distribution 302-4 and a programmed state (PRS) with a threshold voltage distribution 304-4, thus, the memory cells can be accurately sensed by a read voltage in a sensing window 306-4. The sensing windows 306-1, 306-2, 306-3, 306-4 can be referred to generally as sensing windows 306 and individually as sensing window 306. As shown in FIG. 3A, memory cells in different layers have different threshold voltage distributions for the erased state ERS and for the programmed state (PRS), which cause different sensing windows for the memory cells.

In some implementations, a same read voltage is used for sensing memory cells in multiple layers including Layer 1, Layer 2, Layer 3, and Layer 4, e.g., in same block. Curve 312 shows an overall threshold voltage distribution of ERS that covers all the threshold voltage distributions of memory cells in Layer 1, Layer 2, Layer 3, Layer 4, and curve 314 shows an overall threshold voltage distribution of PRS that covers all the threshold voltage distributions of memory cells in Layer 1, Layer 2, Layer 3, Layer 4. An overall sensing window 310 can be defined between the overall threshold voltage distributions of ERS and PRS, e.g., between curves 312 and 314. As the threshold voltage distributions of memory cells in the different layers are different, a range of the overall sensing window 310 is no greater than (e.g., smaller than) that of any one of the individual sensing windows 306-1, 306-2, 306-3, 306-4.

A read reference voltage REF can be determined as a middle voltage in the overall sensing window 310, e.g., an average of a higher limit voltage of curve 312 and a lower limit voltage of curve 314. A read voltage in the overall sensing window 310 can be used to accurately sense memory cells in the multiple layers. The read voltage can be determined based on the read reference voltage, e.g., incrementing or decrementing from the reference voltage. A smaller range of the sensing window can limit or narrow available read voltages for sensing, which can affect a performance of memory devices and thus a sensing yield of memory devices.

Implementation of the present disclosure provide techniques for enlarging sensing windows for different layers in the 3 D memory device, e.g., by using a respective reference voltage for each layer in the 3 D memory device. In such a way, as described with further details in FIG. 3B, the sensing windows for different layers can be no smaller than (e.g., larger than) an overall sensing window for all the different layers. In some implementations, a group of layers having substantially same threshold voltage distributions can be associated with a same read reference voltage.

FIG. 3B illustrates an example 350 of threshold voltage distributions of different layers in a 3 D memory device with corresponding read reference voltages. The 3D memory device can have same memory cell layers (e.g., Layer 1, Layer 2, Layer 3, Layer 4) as the 3 D memory device in FIG. 3A. As illustrated in FIG. 3B, a respective read reference voltage REF 358-1, 358-2, 358-3, 358-4 (referred to generally as read reference voltage 358 and individually as read reference voltage 358), is determined for Layer 1, Layer 2, Layer 3, Layer 4. Accordingly, the sensing windows 306-1, 306-2, 306-3, 306-4 can be individually used in sensing for Layer 1, Layer 2, Layer 3, Layer 4, respectively, which is larger than the overall sensing window 310 for all the four layers.

As discussed with further details below, a reference current used for sensing in a sense amplifier can correspond to a read reference voltage (e.g., the read reference voltage 358). In some implementations, characteristics of layers in a 3 D memory device, e.g., threshold voltage distributions of memory cells in the layers, can be first determined, e.g., by measuring and/or testing the memory cells in the layers. Based on the characteristics of the layers, the layers can be categorized into different groups. Threshold voltage distributions of memory cells in layers of a same group can be substantially same or within a predetermined range. Memory cells in layers of different groups can have different threshold voltage distributions. For each group, a respective reference current can be determined for sensing memory cells in layers in the group. Different groups can be associated with different reference currents. As discussed with further details in FIGS. 4A-4B, associations between group information and information of respective reference currents can be stored and read out for use in the 3 D memory device. The respective reference currents for different layers in the 3 D memory device can be achieved by a reference current circuit in the 3 D memory device, e.g., as discussed with further details in FIG. 5 (using a reference voltage generator generating an adjustable reference voltage to a transistor) and FIG. 6 (using a plurality of reference current sub-circuits to provide respective reference currents for layers in different groups).

Example Structures of Memory Devices

Figure 4A:
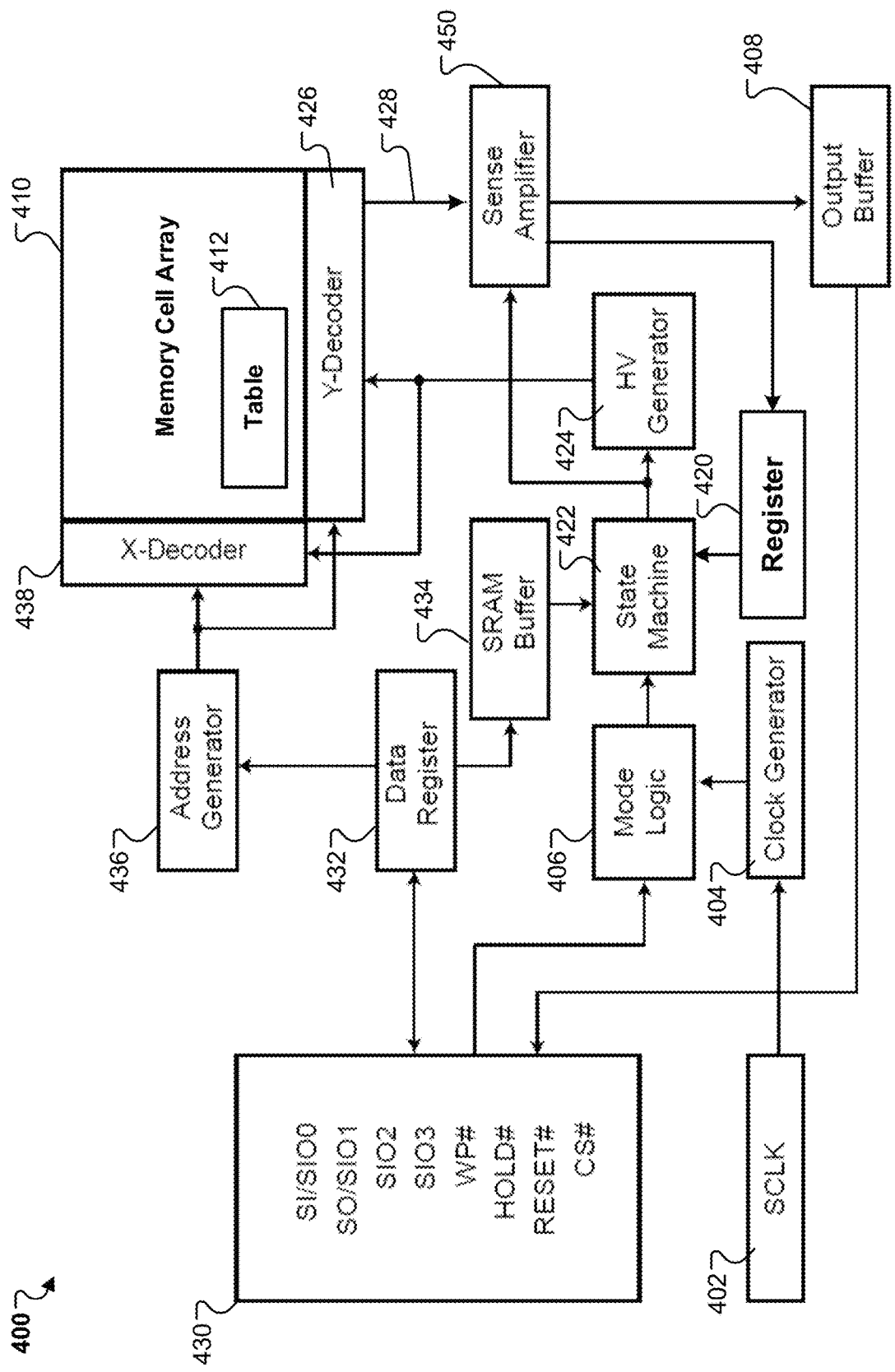
FIG. 4A is a schematic diagram illustrating an example memory device for managing reference currents.
Figure 4B:
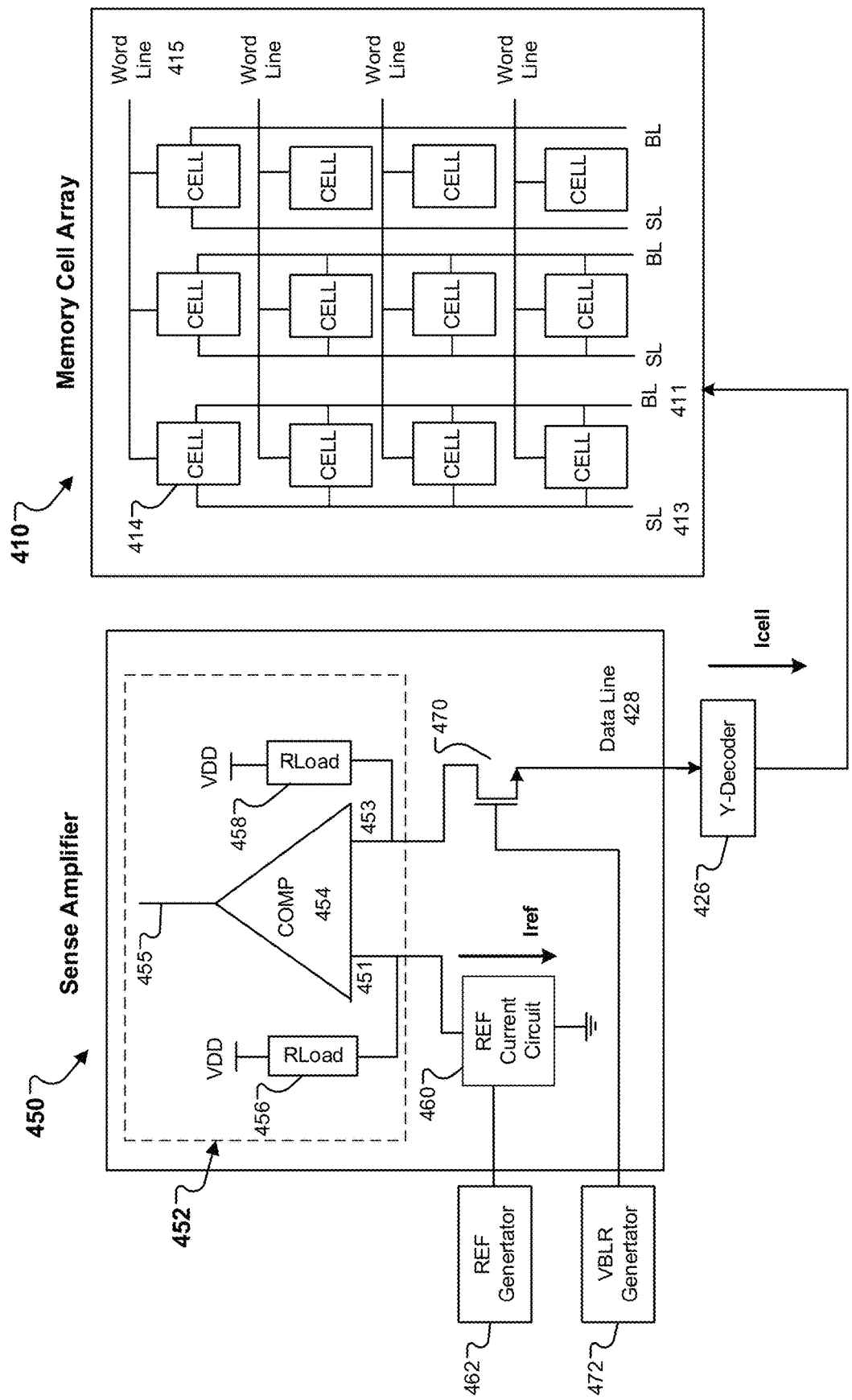
FIG. 4B is a schematic diagram illustrating a sense amplifier and a memory cell array in the memory device of FIG. 4A.

FIG. 4A is a schematic diagram illustrating an example memory device 400 for managing reference currents. The memory device can be the memory device 116 of FIG. 1A, the memory device 170 of FIG. 1B, or the 3D memory device 200 of FIGS. 2A-2B. The memory device 400 includes a memory cell array 410 (e.g., the memory cell array 210 of FIGS. 2A-2B) and a sense amplifier 450. FIG. 4B is a schematic diagram illustrating the sense amplifier 450 and the memory cell array 410 in the memory device 400 of FIG. 4A.

As illustrated in FIG. 4A, the memory device 400 includes a number of components that can be integrated onto a board, e.g., a Si-based carrier board, and be packaged. The memory cell array 410 can include a number of memory cells 414 (e.g., the memory cells 242 of FIG. 2B). Each memory cell 414 can include at least one memory transistor configured as a storage element to store data. The memory transistor can include a silicon-oxide-nitride-oxide-silicon (SONOS) transistor, a floating gate transistor, a nitride read only memory (NROM) transistor, or any suitable non-volatile memory metal-oxide-semiconductor (MOS) device that can store charges.

The memory device 400 can include an X-decoder (or row decoder) 438 and optionally a Y-decoder (or column decoder) 426. Each memory cell can be coupled to the X-decoder 438 via a respective word line 415 (e.g., the word line layer 212 of FIGS. 2A-2B) and coupled to the Y-decoder 426 via a respective bit line 411 (e.g., the bit line 222 of FIGS. 2A-2B) and/or a respective source line 413 (e.g., the source line 224 of FIGS. 2A-2B). Accordingly, each memory cell can be selected by the X-decoder 238 and the Y-decoder 248 for read or write operations through the respective word line 415, the respective bit line 411, and the respective source line 413.

The memory device 400 can include a memory interface (input/output—I/O) 430 having multiple pins configured to be coupled to an external device, e.g., the device controller 112 and/or the host device 120 of FIG. 1A or the controller 160 of FIG. 1B. In some implementations, the pins in the memory interface 430 can include SI/SIO0 for serial data input/serial data input & output, SO/SIO1 for serial data output/serial data input &output, SIO2 for serial data input or output, SIO3 for serial data input or output, RESET #for hardware reset pin active low, and CS #for chip select. The memory interface 430 can also include one or more other pins, e.g., WP #for write protection active low, and/or Hold #for a holding signal input.

The memory device 400 can include a data register 432, an SRAM buffer 434, an address generator 436, a synchronous clock (SCLK) input 402, a clock generator 404, a mode logic 406, a state machine 422, and a high voltage (HV) generator 424. The SCLK input 402 can be configured to receive a synchronous clock input and the clock generator 404 can be configured to generate a clock signal for the memory device 400 based on the synchronous clock input. The mode logic 406 can be configured to determine whether there is a read or write operation and provide a result of the determination to the state machine 422.

The memory device 400 can also include the sense amplifier 450 that can be optionally connected to the Y-decoder 426 by a data line 428 and an output buffer 408 for buffering an output signal from the sense amplifier 450 to the memory interface 430. The sense amplifier 450 can be part of read circuitry that is used when data is read from the memory device 400. The sense amplifier 450 can be configured to sense low power signals from a bit line that represents a data bit (1 or 0) stored in a memory cell and to amplify small voltage swings to recognizable logic levels so the data can be interpreted properly. The sense amplifier 450) can also communicate with the state machine 422. e.g., bidirectionally.

A controller, e.g., the host controller 122 or the device controller 112 of FIG. 1A or the controller 160 of FIG. 1B, can generate commands, such as read commands and/or write commands that can be executed respectively to read data from and/or write data to the memory device 400. Data being written to or read from the memory the array 410 can be communicated or transmitted between the memory device 400) and the controller and/or other components via a data bus (e.g., a system bus), which can be a multi-bit bus.

In some examples, during a read operation, the memory device 400 receives a read command from the controller through the memory interface 430. The state machine 422 can provide control signals to the HV generator 424 and the sense amplifier 450. The sense amplifier 450 can also send information. e.g., sensed logic levels of data, back to the state machine 422. The HV generator 424 can provide a voltage to the X-decoder 438 and the Y-decoder 426 for selecting a memory cell. The sense amplifier 450 can sense a small power (voltage or current) signal from a bit line that represents a data bit (1 or 0) stored in the selected memory cell and amplify the small power signal swing to recognizable logic levels so the data bit can be interpreted properly by logic outside the memory device 400. The output buffer 408 can receive the amplified voltage from the sense amplifier 450 and output the amplified power signal to the logic outside the memory device 400 through the memory interface 430.

In some examples, during a write operation, the memory device 400 receives a write command from the controller. The data register 432 can register input data from the memory interface 430, and the address generator 436 can generate corresponding physical addresses to store the input data in specified memory cells of the memory cell array 410.

The address generator 436 can be connected to the X-decoder 438 and Y-decoder 426 that are controlled to select the specified memory cells through corresponding word lines and bit lines. The SRAM buffer 434 can retain the input data from the data register 432 in its memory as long as power is being supplied. The state machine 422 can process a write signal from the SRAM buffer 434 and provide a control signal to the HV generator 424 that can generate a write voltage and provide the write voltage to the X-decoder 438 and the Y-decoder 426. The Y-decoder 426 can be configured to output the write voltage to the bit lines for storing the input data in the specified memory cells. The state machine 422 can also provide information. e.g., state data, to the SRAM buffer 434. The SRAM buffer 434 can communicate with the output buffer 408, e.g., sending information or data out to the output buffer 408.

In some implementations, the memory cell array 410 includes layers of memory cells, e.g., the layers 240 of FIG. 2A-2B. The layers can be categorized in a plurality of groups based on characteristics of the layers, e.g., threshold voltage distributions of memory cells in the layers. Threshold voltage distributions of memory cells in layers of a same group can be substantially same or within a predetermined range. For example, a difference between lower limit voltages (or higher limit voltages) of the memory cells in the group is less than a predetermined threshold. Memory cells in layers of different groups can have different threshold voltage distributions. For each group, a respective reference current can be determined for sensing memory cells in layers in the group. Different groups can be associated with different reference currents. Associations between group information of the groups and information of respective reference currents can be stored in the memory device 400, e.g., in a table (or register) 412 that can be stored in the memory cell array 410 or in circuitry peripheral to the memory cell array 410 in the memory device 400.

The group information of a group includes address information of layers in the group. Address information of a layer can include an identifier of the layer (e.g., layer number and/or block number) or a memory address (e.g., a starting address) of the layer in the memory cell array 410. Information of a reference current can include an option code having respective values for the different groups. For example, layers in the 3D memory devices can be categorized in four groups 3, 2, 1, 0), and an option code for a group can have 4 bits. The option code for layers in Group 3, Group 2, Group 1, Group 0) can be [1 0 0 0], [0 1 0 0], [0 0 1 0], and [0 0 0 1], respectively. That is, when a layer in one group is identified, the layer in the group is provided with a corresponding reference current for the group, while there is no reference current to be provided to layers in the other three groups. Different option codes can be associated with corresponding reference currents for different groups.

In some implementations, according to address information, e.g., in a read command from a controller (e.g., the device controller 112 or the host controller 122 of FIG. 1A or the controller 160 of FIG. 1B), a layer in the memory device 400 can be identified. Then, based on stored associations (e.g., in the table 412) between a group including the layer and information of a reference current for the group, the information of the corresponding reference current (e.g., an option code) can be identified or determined. The option code can be read into a register 420 through the sense amplifier 450. The register 420 can provide the option code to the state machine 422.

Figure 5:
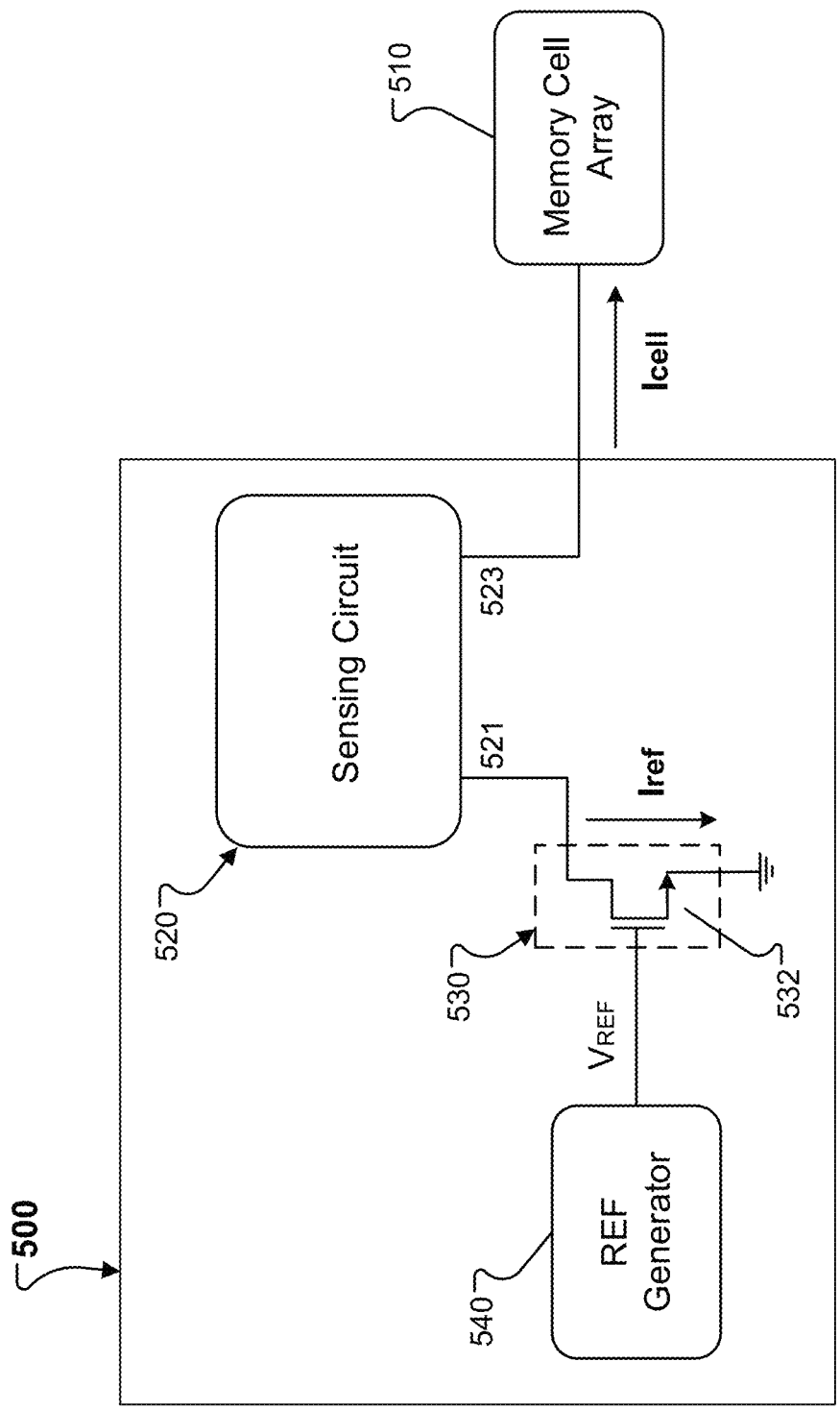
FIG. 5 is a schematic diagram illustrating example circuitry for managing reference currents in a semiconductor device.

In some implementations, e.g., as discussed with further details in FIG. 5, the state machine 422 can generate a corresponding control signal based on the option code and provide the corresponding control signal to a reference voltage generator 462 (as shown in FIG. 4B) to generate a corresponding reference voltage based on the corresponding control signal. The corresponding reference voltage can be provided to a reference current circuit 460 (as shown in FIG. 4B) to generate a corresponding reference current for sensing memory cells in the identified layer.

Figure 6:
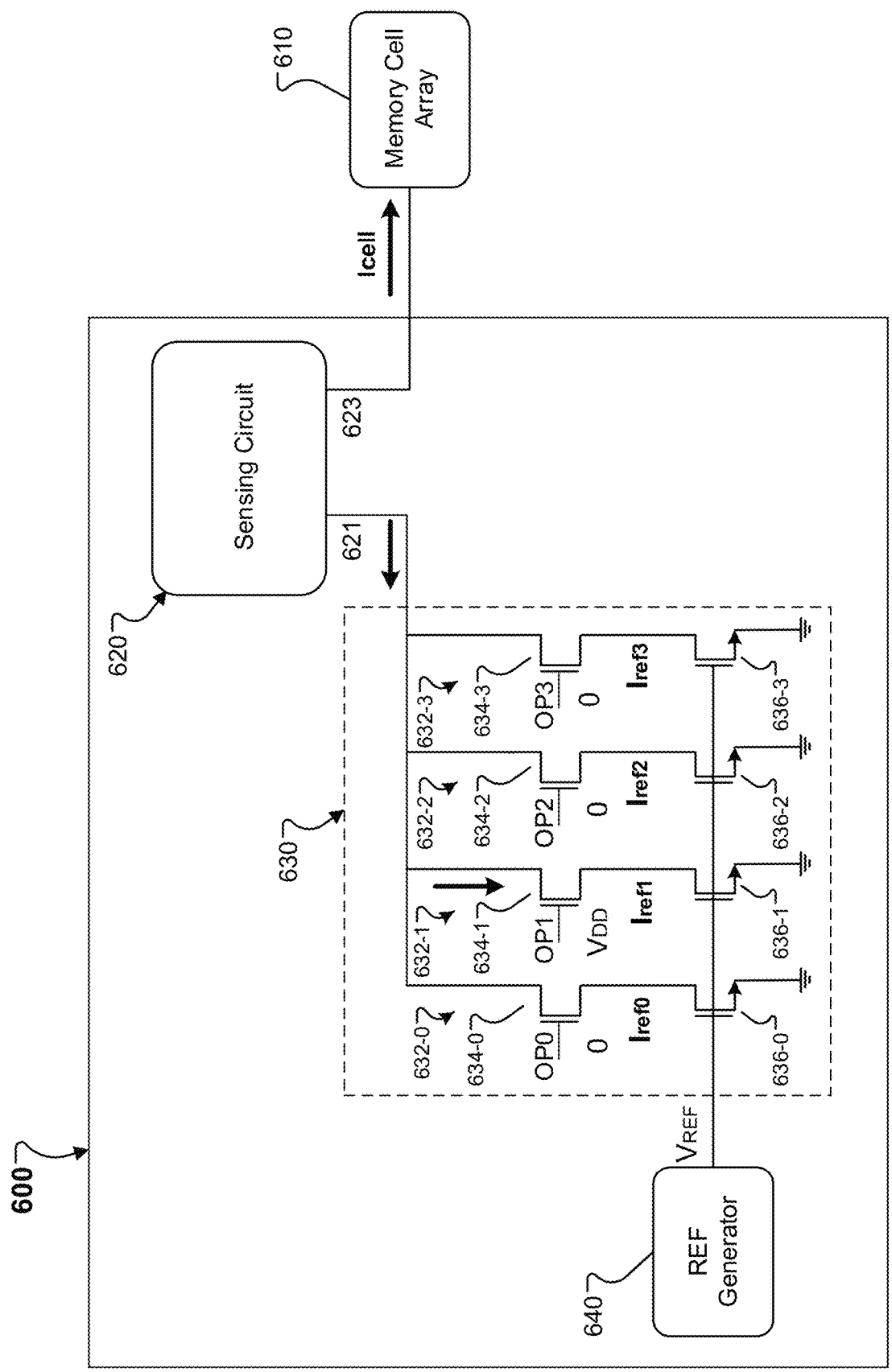
FIG. 6 is a schematic diagram illustrating another example circuitry for managing reference currents in a semiconductor device.

In some implementations, e.g., as discussed with further details in FIG. 6, the state machine 422 can generate multiple corresponding control signals based on the option code and provide the multiple corresponding control signals to a voltage generator (e.g., the HV generator 424) to generate multiple corresponding control voltages (e.g., gate voltages) to turn on or off multiple reference current sub-circuits in the reference current circuit 460. For example, the option code [0 0 1 0] for Group 1 corresponds to control voltages [0 0 $V_{DD}$ 0] for turning on a second reference current sub-circuit for Group 1 and turning off the other three reference current sub-circuits for Groups 0, 2, 3. That is, the option code for a group can be used to select a corresponding reference current sub-circuit to generate a corresponding reference current.

In some implementations, as illustrated in FIG. 4B, the sense amplifier 450 includes a sensing circuit 452 having a reference node 451 and a sensing node 453. The sensing node 453 of the sensing circuit 452 is coupled to the memory cell array 410 through a clamping transistor 470. The clamping transistor 470 is electrically coupled to a bit line voltage (VBLR) generator 472. The clamping transistor 470 can be an n-channel transistor, e.g., NMOS transistor. The clamping transistor 470 is configured to receive a gate voltage from the VBLR generator 472 at a gate terminal and generate a data voltage at a source terminal. The data voltage is considered as the bit line clamping voltage that can be stable and independent from PVT (process-voltage-temperature) effect. The bit line clamping voltage can be provided to a bit line 411 (and/or a source line 413) in the memory cell array 410 through the data line 428 and the Y-decoder 426. A sensing current Icell can be generated and flow along a current path from the sensing node 453 of the sensing circuit 452 to the memory cell array 410.

The reference node 451 is coupled to the reference current circuit 460 that can be coupled to a ground. The reference current circuit 460 can be configured to receive a reference voltage generated by the reference voltage generator 462. A reference current $I_{ref}$ can be generated based on the reference voltage and flows a current path from the reference node 451 of the sensing circuit 452 to the ground through the reference current circuit 460. The reference current $I_{ref}$ can be stable, e.g., independent from PVT effect.

The sensing circuit 452 can include a comparator 454. A supply voltage VDD can be provided to the reference node 451 and the sensing node 453 of the comparator 454 through respective loads (e.g., resistors) 456, 458. During a read operation, the comparator 454 is configured to compare a cell voltage $V_{cell}$ at the sensing node 453 and a reference voltage $V_{ref}$ at the reference node 451 and output an output signal at an output 455. The reference voltage $V_{ref}$ is associated with the reference current $I_{ref}$ and the load 456, and the cell voltage $V_{cell}$ is associated with the sensing current Icell and the load 458. The output signal corresponds to a voltage difference between the cell voltage $V_{cell}$ and the reference voltage $V_{ref}$. The output signal from the comparator 454 can be further sent to an amplifier in the sense amplifier 450. The output signal corresponds to a value of data (1 or 0) stored in a memory cell 414 connected to the bit line 411 and/or the source line 413. In some implementations, the loads 456 and 458 can be configured such that the voltages $V_{ref}$ and $V_{cell}$ at the reference node 451 and the sensing node 453 are equal at an initial condition, that is, before the memory cell 414 is in a read operation or before the sense amplifier 450 senses the memory cell 414.

Example Reference Current Circuits

FIG. 5 is a schematic diagram illustrating example circuitry 500 for managing reference currents in a semiconductor device. The semiconductor device can be a memory device, e.g., the memory device 116 of FIG. 1A, the memory device 170 of FIG. 1B, the 3D memory device 200 of FIGS. 2A-2B, or the memory device 400 of FIGS. 4A-4B. The semiconductor device includes a memory cell array 510 (e.g., the memory cell array 210 of FIGS. 2A-2B or the memory cell array 410 of FIGS. 4A-4B) and the circuitry 500 coupled to the memory cell array 510. The memory cell array 510 can include multiple memory cell layers (e.g., the layers 240 of FIGS. 2A-2B or Layers 1, 2, 3, 4 of FIGS. 3A-3B) of memory cells (e.g., the memory cell 242 of FIG. 2B or 414 of FIG. 4B).

The circuitry 500 can include one or more components in the semiconductor device, e.g., registers 420, interface 430), data register 432, SRAM buffer 434, address generator 436, X-decoder 438, mode logic 406, state machine 422, HV generator 424, Y-decoder 426, sense amplifier 450, and/or output buffer 408, as illustrated in FIG. 4A-4B.

In some implementations, e.g., as illustrated in FIG. 5, the circuitry 500 includes a sensing circuit 520) (e.g., the sensing circuit 452 of FIG. 4B), a reference current circuit 530) (e.g., the reference current circuit 460 of FIG. 4B), and a reference voltage generator 540 (e.g., the reference voltage generator 462 of FIG. 4B). The sensing circuit 520 can have a reference node 521 (e.g., the reference node 451 of FIG. 4B) and a sensing node 523 (e.g., the sensing node 453 of FIG. 4B). The sensing circuit 520 can include a comparator (e.g., the comparator 454 of FIG. 4B), and can be included in a sense amplifier (e.g., the sense amplifier 450 of FIGS. 4A-4B).

The sensing node 523 of the sensing circuit 520 is coupled to the memory cell array 510, e.g., through a transistor such as the clamping transistor 470 of FIG. 4B. In a read operation, a sensing current Icell flows along a current path from the sensing node 523 to the memory cell array 510.

In some implementations, the reference current circuit 530 includes a transistor 532 (e.g., n-type transistor such as NMOS transistor). The transistor 532 has a first terminal coupled to the reference node 521 of the sensing circuit 520, a second terminal coupled to a ground, and a gate terminal coupled to the reference voltage generator 540 and configured to receive a reference voltage $V_{REF}$ from the reference voltage generator 540 as a gate voltage.

In a read operation, as discussed above, a memory cell layer in the memory cell array 510 can be first identified for sensing, e.g., based on address information (such as a starting address) of the memory cell layer. Based on an association between the memory cell layer or a group including the memory cell layer and a corresponding reference current, e.g., stored in a table such as the table 412 of FIG. 4A, the circuitry 500 can determine information of the corresponding reference current. The information of the corresponding reference current can be an option code. Based on the information of the corresponding reference current, the circuitry 500 can generate a corresponding control signal (e.g., by a state machine such as 422 of FIG.

4A) and provide the corresponding control signal to the reference voltage generator 540 to generate a corresponding reference voltage $V_{REF}$ based on the corresponding control signal. The corresponding reference voltage $V_{REF}$ can be provided to the reference current circuit 530 or the transistor 532 to generate a corresponding reference current $I_{REF}$ for sensing memory cells in the identified memory cell layer.

FIG. 6 is a schematic diagram illustrating another example circuitry 600 for managing reference currents in a semiconductor device. The semiconductor device can be a memory device, e.g., the memory device 116 of FIG. 1A, the memory device 170 of FIG. 1B, the 3 D memory device 200 of FIGS. 2A-2B, or the memory device 400 of FIGS. 4A-4B. The semiconductor device includes a memory cell array 610 (e.g., the memory cell array 210 of FIGS. 2A-2B or the memory cell array 410 of FIGS. 4A-4B) and the circuitry 600 coupled to the memory cell array 610. The memory cell array 610 can include multiple memory cell layers (e.g., the layers 240 of FIGS. 2A-2B or Layers 1, 2, 3, 4 of FIGS. 3A-3B) of memory cells (e.g., the memory cell 242 of FIG. 2B or 414 of FIG. 4B).

The circuitry 600 can include one or more components in the semiconductor device, e.g., registers 420), interface 430), data register 432, SRAM buffer 434, address generator 436, X-decoder 438, mode logic 406, state machine 422, HV generator 424, Y-decoder 426, sense amplifier 450), and/or output buffer 408, as illustrated in FIG. 4A-4B.

In some implementations, e.g., as illustrated in FIG. 6, the circuitry 600 includes a sensing circuit 620) (e.g., the sensing circuit 452 of FIG. 4B), a reference current circuit 630) (e.g., the reference current circuit 460) of FIG. 4B), and a reference voltage generator 640 (e.g., the reference voltage generator 462 of FIG. 4B). The sensing circuit 620 can have a reference node 621 (e.g., the reference node 451 of FIG. 4B) and a sensing node 623 (e.g., the sensing node 453 of FIG. 4B). The sensing circuit 620 can include a comparator (e.g., the comparator 454 of FIG. 4B), and can be included in a sense amplifier (e.g., the sense amplifier 450 of FIGS. 4A-4B).

The sensing node 623 of the sensing circuit 620 is coupled to the memory cell array 610, e.g., through a transistor such as the clamping transistor 470 of FIG. 4B. In a read operation, a sensing current Icell flows along a current path from the sensing node 623 to the memory cell array 610.

In some implementations, as illustrated in FIG. 6, different from the reference current circuit 530 of FIG. 5, the reference current circuit 630 includes a plurality of reference current sub-circuits 632-0), 632-1, 632-2, 632-3 (referred to generally as reference current sub-circuits 632 and individually as reference current sub-circuit 632). For illustration purposes, four reference current sub-circuits are illustrated in FIG. 6, for four groups determined for the memory cell layers in the memory cell array 610. More or less reference current sub-circuits depend on corresponding number of groups determined for layers in the memory cell array 610.

The reference current sub-circuits 632 are arranged between the sensing circuit 620 and a ground in parallel. Each reference current sub-circuit 632 has a first node coupled to the reference node 621 of the sensing circuit 620, a second node coupled to the ground, and a third node coupled to the reference voltage generator 640 for receiving a reference voltage $V_{REF}$. Different from the reference voltage generator 540 of FIG. 5, the reference voltage generator 640) is configured to provide a same reference voltage $V_{REF}$ to all the reference current sub-circuits 632. The reference current sub-circuits 632-0, 632-1, 632-2, 632-3 are individually configured to generate respective, different reference currents $I_{ref0}$, $I_{ref1}$, $I_{ref2}$, $I_{ref3}$ based on the same reference voltage $V_{REF}$. The values of the different reference currents $I_{ref0}$, $I_{ref1}$, $I_{ref2}$, $I_{ref3}$ correspond to predetermined reference currents for different groups. The predetermined reference currents can be predetermined based on characteristics of layers in the different groups (e.g., threshold voltage distributions of memory cells in the layers). In some examples, the predetermined reference currents can be based on a based reference current $I_0$. For example, the different reference currents $I_{ref0}$, $I_{ref1}$, $I_{ref2}$, $I_{ref3}$ can be $0.9*I_0$, $1*I_0$, $1.1*I_0$, $1.2*I_0$.

In some implementations, as illustrated in FIG. 6, each reference current sub-circuit 632-0, 632-1, 632-2, 632-3 includes a respective reference transistor 636-0, 636-1, 636-2, 636-3 (referred to generally as reference transistors 636 and individually as reference transistor 636). The reference transistor 636 can be an n-channel transistor (e.g., NMOS transistor) and can have a first terminal coupled to the reference node 621 of the sensing circuit 620, a second terminal coupled to the ground, and a gate terminal coupled to the reference voltage generator 640 for receiving the reference voltage $V_{REF}$ as a gate voltage. The reference transistors 636-0, 636-1, 636-2, 636-3 are individually configured to generate the respective reference currents $I_{ref0}$, $I_{ref1}$, $I_{ref2}$, $I_{ref3}$ based on the reference voltage $V_{REF}$.

In some implementations, as illustrated in FIG. 6, each reference current sub-circuit 632-0, 632-1, 632-2, 632-3 further includes a respective switching transistor 634-0, 634-1, 634-2, 634-3 (referred to generally as switching transistors 634 and individually as switching transistor 634) coupled in series with the respective reference transistor 636-0, 636-1, 636-2, 636-3 between the reference node 621 of the sensing circuit 620 and the ground. The switching transistor 634 is configured to turn on or turn off the reference current sub-circuit 632. In some examples, the switching transistor 634 has a first terminal coupled to the reference node 621, a second terminal coupled to the reference transistor 636 (e.g., at the first terminal), and a gate terminal. The switching transistor 634 is configured to receive a gate control signal at the gate terminal for switching on or off the switching transistor 634, to turn on or off the reference current sub-circuit 632.

In a read operation, as discussed above, a memory cell layer in the memory cell array 610 can be first identified for sensing, e.g., based on address information (such as a starting address) of the memory cell layer. Based on an association between the memory cell layer or a group including the memory cell layer and a corresponding reference current, e.g., stored in a table such as the table 412 of FIG. 4A, the circuitry 600 can determine information of the corresponding reference current. The corresponding reference current can be generated by a corresponding reference current sub-circuit, e.g., 632-1, in the reference current circuit 630.

The information of the corresponding reference current can be an option code. The option code can include multiple values corresponding to different groups. The circuitry 600 (e.g., the state machine 422 of FIG. 4A) can generate multiple corresponding control signals based on the option code and provide the multiple corresponding control signals to a voltage generator (e.g., the HV generator 424) to generate multiple corresponding control voltages (e.g., gate voltages) to selectively turn on or off the reference current sub-circuits 632 in the reference current circuit 630. For example, the option code [0 0 1 0] for Group 1 corresponds to control voltages [0 0 $V_{DD}$ 0] for turning on the reference current sub-circuit 632-1 for Group 1 and turning off the other three reference current sub-circuits 632-0, 632-2, 632-3 for Groups 0, 2, 3. That is, the option code for a group can be used to select a corresponding reference current sub-circuit to generate a corresponding reference current.

Example Process

Figure 7:
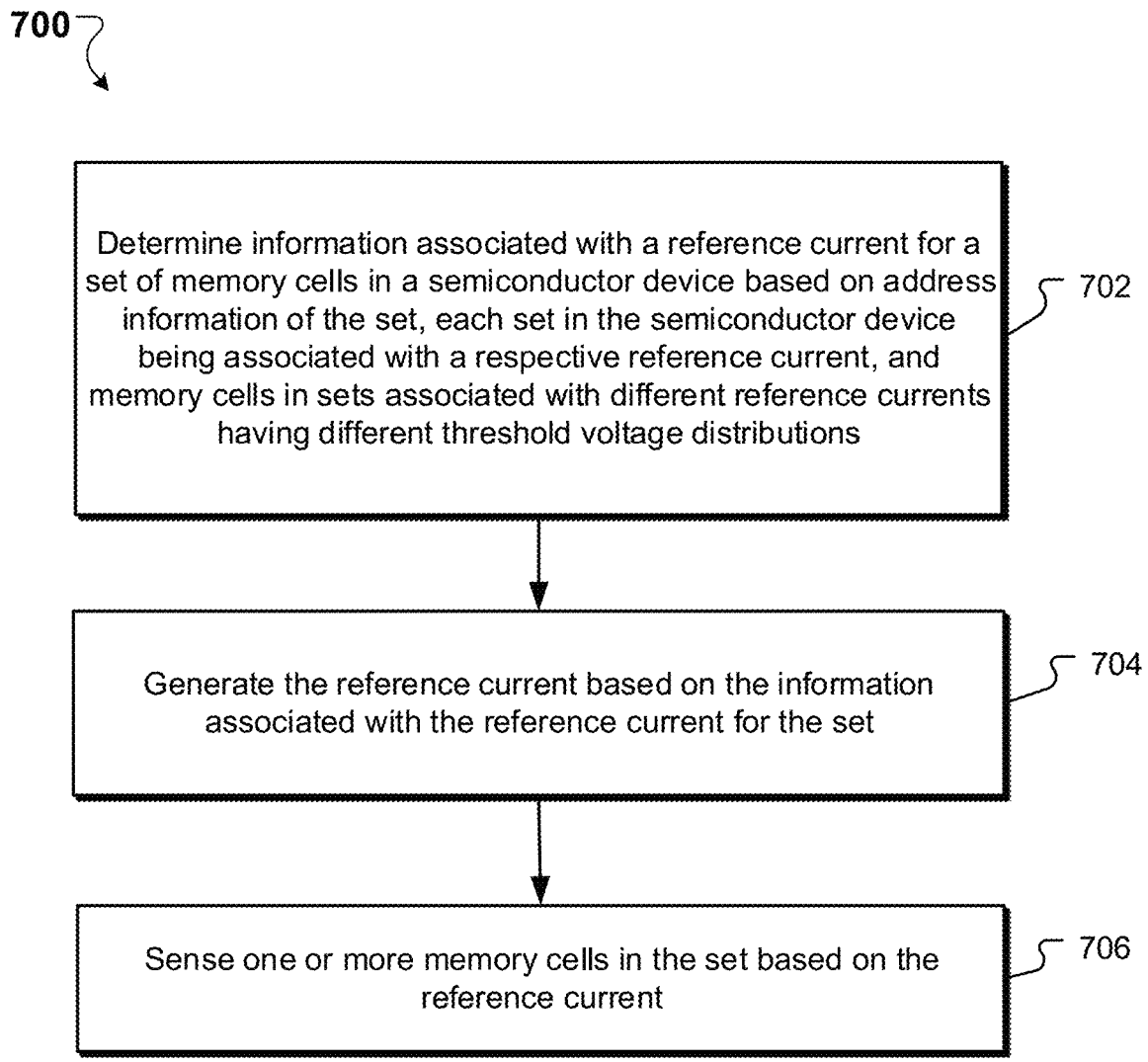
FIG. 7 is a flow chart of an example of a process for managing reference currents in a semiconductor device.

FIG. 7 is a flow chart of an example of a process 700 for managing reference currents in a semiconductor device, according to one or more embodiments of the present disclosure. The process 700 can be performed by the semiconductor device, which can be, e.g., any of the memory device 116 of FIG. 1A, the memory device 170 of FIG. 1B, the memory device 200 of FIGS. 2A-2B, or the memory devices 400 of FIGS. 4A-4B, or the semiconductor device as described with respect to FIG. 5 or FIG. 6. As an example, the semiconductor device is a 3D NOR flash memory device.

The semiconductor device can include a memory cell array (e.g., the memory cell array 410 of FIG. 4A, 510 of FIG. 5, or 610 of FIG. 6) and circuitry coupled to the memory cell array. The process 700 can be performed by the circuitry of the semiconductor device. In some implementations, the circuitry can include one or more components in the memory device 400 of FIGS. 4A-4B, e.g., registers 420), interface 430, data register 432, SRAM buffer 434, address generator 436, X-decoder 438, mode logic 406, state machine 422, HV generator 424, Y-decoder 426, sense amplifier 450, and/or output buffer 408.

In some examples, the circuitry can be the circuitry 500 of FIG. 5 and include a sensing circuit (e.g., the sensing circuit 520 of FIG. 5), a reference current circuit (e.g., the reference current circuit 530 of FIG. 5), and a reference voltage generator (e.g., the reference voltage generator 540 of FIG. 5). In some examples, the circuitry can be the circuitry 600 of FIG. 6 and can include a sensing circuit (e.g., the sensing circuit 620 of FIG. 6), a reference current circuit (e.g., reference current circuit 630 of FIG. 6), and a reference voltage generator (e.g., the reference voltage generator 640 of FIG. 6).

The memory cell array can store data in multiple sets of memory cells (e.g., the memory cell 242 of FIG. 2B or 414 of FIG. 4B). In some examples, a set of memory cells can be a memory cell layer in a 3D memory device (e.g., the layers 240 of FIGS. 2A-2B or Layers 1, 2, 3, 4 of FIGS. 3A-3B). In some examples, a set of memory cells can be a memory cell page in a 2D memory device.

Each set of memory cells in the semiconductor device can be associated with a respective reference current, and memory cells in sets associated with different reference currents can have different threshold voltage distributions. In some implementations, each reference current is associated with a respective group of sets in the memory cell array, and threshold voltage distributions of memory cells in sets of a same group are substantially same or within a predetermined range. In some implementations, the semiconductor device includes a table (e.g., the table 412 of FIG. 4A) or register configured to store associations between information associated with the sets or groups including the sets and information of the respective reference currents. The table or register can be stored in at least one of the memory cell array or in the circuitry.

In some implementations, group information of a group includes address information of sets in the group. Address information of a set can include an identifier of the set (e.g., layer number and/or block number) or a memory address (e.g., a starting address) of the set in the memory cell array.

Information of a reference current can include an option code having respective values for the different groups. When a layer in one group is identified, the layer in the group is provided with a corresponding reference current for the group, while there is no reference current to be provided to layers in the other groups. Different option codes can be associated with corresponding reference currents for different groups.

At 702, the circuitry determines information associated with a reference current for a set of memory cells in the semiconductor device based on address information of the set. For example, the semiconductor device can receive a read command from a controller, e.g., the host controller 122 or the device controller 112 of FIG. 1A or the controller 160 of FIG. 1B. The read command can include the address information of the set. As noted above, the address information of the set can include an identifier of the set (e.g., layer number and/or block number) or a memory address (e.g., a starting address) of the set in the memory cell array. The circuitry can determine the information associated with the reference current for the set based on an association between the information associated with the reference current and the address information of the set.

At 704, the circuitry generates the reference current based on the information associated with the reference current for the set. In some implementations, the circuitry includes a reference current circuit (e.g., the reference current circuit 460 in FIG. 4B, 530 in FIG. 5, or 630 in FIG. 6) coupled to a reference voltage generator (e.g., the reference voltage generator 462 of FIG. 4B, 540 of FIG. 5, or 640) of FIG. 6). The reference current circuit is configured to receive a reference voltage from the reference voltage generator. The reference current is generated based on the reference voltage.

In some implementations, the circuitry further includes a sensing circuit (e.g., the sensing circuit 452 in FIG. 4B, 520 in FIG. 5, or 620 in FIG. 6) having a reference node (e.g., the reference node 451 of FIG. 4B, 521 of FIG. 5, or 621 of FIG. 6) coupled to the reference current circuit and a sensing node (e.g., the sensing node 453 of FIG. 4B, 523 of FIG. 5, or 623 of FIG. 6) coupled to the memory cell array. The circuitry can include a sense amplifier (e.g., the sense amplifier 450 of FIGS. 4A-4B) including the sensing circuit, and the sensing circuit can include a comparator (e.g., the comparator 454 of FIG. 4B).

The reference current circuit can include a first node coupled to the reference node of the sensing circuit, a second node coupled to a ground, and a third node coupled to the reference voltage generator. In a read operation, the reference current flows from the sensing circuit through the reference current circuit to the ground when the third node of the reference current circuit receives the reference voltage from the reference voltage generator.

In some implementations, the reference current circuit includes a transistor (e.g., the transistor 532 of FIG. 5) having a first terminal as the first node, a second terminal as the second node, and a gate terminal as the third node. The reference voltage generator is configured to generate the reference voltage based on the information associated with the reference current, and the reference current is generated based on the reference voltage and flows through the transistor.

In some implementations, the reference current circuit includes a plurality of reference current sub-circuits (e.g., the reference current sub-circuits 632 of FIG. 6) that are coupled in parallel between the sensing circuit and the ground. Each of the plurality of reference current sub-circuits is configured to generate a corresponding reference current (e.g., $I_{ref0}$, $I_{ref1}$, $I_{ref2}$, $I_{ref3}$) based on the reference voltage, and corresponding reference currents generated by the plurality of reference current sub-circuits are different from each other.

In some implementations, one of the plurality of reference current sub-circuits is configured to be turned on based on the information associated with the reference current for the set and to generate the reference current based on the reference voltage, the reference current flowing through the one of the plurality of reference current sub-circuits. One or more other sub-circuits of the plurality of reference current sub-circuits are configured to be turned off based on the information associated with the reference current for the set, and no reference current flows through the one or more other sub-circuits when the one of the plurality of reference current sub-circuits is turned on.

In some implementations, each of the plurality of reference current sub-circuits includes a switching transistor (e.g., the switching transistor 634 of FIG. 6) configured to be switched on or off based on a control signal and a reference transistor (e.g., the switching transistor 636 of FIG. 6) coupled to the reference voltage generator and configured to receive the reference voltage from the reference voltage generator. The switching transistor and the reference transistor are coupled in series between the sensing circuit and the ground. Each of the plurality of reference current sub-circuits is configured to: be turned on to generate the respective reference current if the switching transistor is switched on, and be turned off if the switching transistor is switched off.

In some implementations, the information associated with the reference current for the set comprises an option code having respective values for the plurality of reference current sub-circuits. The circuitry is configured to generate corresponding control signals for the switching transistors in the plurality of reference current sub-circuits based on the respective values of the option code, the corresponding control signals being configured to turn on one of the plurality of reference current sub-circuits and to turn off one or more other ones of the plurality of reference current sub-circuits, e.g., as illustrated in FIG. 6.

At 706, the circuitry senses one or more memory cells in the set based on the reference current. The circuitry can be configured to: provide a sensing current to a memory cell in the set (e.g., as illustrated in FIG. 4B, FIG. 5, or FIG. 6), and sense the memory cell in the set based on the sensing current and the reference current.

In some implementations, the circuitry includes a sensing transistor (e.g., the clamping transistor 470 of FIG. 4B) coupled to a bit line voltage generator (e.g., the VBLR generator 472 of FIG. 4B) and configured to receive a bit line clamping voltage from the bit line voltage generator. The sensing current can be generated based on the bit line clamping voltage and flows through the sensing transistor.

In some implementations, the circuitry includes a comparator (e.g., the comparator 454 of FIG. 4B), and the circuitry is configured to sense the memory cell in the set based on a comparison of the sensing current and the reference current. The circuitry can then send a sensing result of the memory cell in the set to the controller.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices: magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device, comprising:
a memory cell array configured to store data in sets of memory cells, wherein each set of a plurality of sets of memory cells in the memory cell array is associated with a respective reference current, and memory cells in the plurality of sets associated with different reference currents have different threshold voltage distributions, and wherein associations between address information of the plurality of sets and information associated with the different reference currents are stored in the semiconductor device; and
circuitry coupled to the memory cell array and configured to:
determine information associated with a reference current for a set of memory cells in the memory cell array based on address information of the set and a stored association between the address information of the set and the information associated with the reference current, the information associated with the reference current comprising a corresponding option code having respective values for the plurality of sets, the respective values of the corresponding option code indicating a selection of the set, among the plurality of sets, for generation of the reference current, a respective value for the set in the corresponding option code enabling the generation of the reference current for the set,
generate the reference current based on the respective value for the set in the corresponding option code of the information associated with the reference current for the set, and
sense one or more memory cells in the set based on the reference current.

2. The semiconductor device of claim 1, wherein the circuitry is configured to:
provide a sensing current to a memory cell in the set; and
sense the memory cell in the set based on the sensing current and the reference current.

3. The semiconductor device of claim 2, wherein the circuitry is configured to sense the memory cell in the set based on a comparison of the sensing current and the reference current.

4. The semiconductor device of claim 1, wherein the circuitry comprises a reference current circuit coupled to a reference voltage generator and configured to receive a reference voltage from the reference voltage generator.

5. The semiconductor device of claim 4, wherein the circuitry further comprises a sensing circuit having a reference node coupled to the reference current circuit and a sensing node coupled to the memory cell array,
wherein the reference current circuit comprises a first node coupled to the reference node of the sensing circuit, a second node coupled to a ground, and a third node coupled to the reference voltage generator, and
wherein the reference current flows from the sensing circuit through the reference current circuit to the ground when the third node of the reference current circuit receives the reference voltage from the reference voltage generator.

6. The semiconductor device of claim 5, wherein the circuitry comprises a sense amplifier including the sensing circuit, and the sensing circuit comprises a comparator.

7. The semiconductor device of claim 5, wherein the reference current circuit comprises a transistor having a first terminal as the first node, a second terminal as the second node, and a gate terminal as the third node,
wherein the reference voltage generator is configured to generate the reference voltage based on the information associated with the reference current, and
wherein the reference current is generated based on the reference voltage and flows through the transistor.

8. The semiconductor device of claim 5, wherein the reference current circuit comprises a plurality of reference current sub-circuits that are coupled in parallel between the sensing circuit and the ground, and
wherein each of the plurality of reference current sub-circuits is configured to generate a corresponding reference current based on the reference voltage, corresponding reference currents generated by the plurality of reference current sub-circuits being different from each other.

9. The semiconductor device of claim 8, wherein one of the plurality of reference current sub-circuits is configured to be turned on based on the information associated with the reference current for the set and to generate the reference current based on the reference voltage, the reference current flowing through the one of the plurality of reference current sub-circuits.

10. The semiconductor device of claim 9, wherein one or more other sub-circuits of the plurality of reference current sub-circuits are configured to be turned off based on the information associated with the reference current for the set, and
wherein no reference current flows through the one or more other sub-circuits when the one of the plurality of reference current sub-circuits is turned on.

11. The semiconductor device of claim 8, wherein each of the plurality of reference current sub-circuits comprises:
a switching transistor configured to be switched on or off based on a control signal; and
a reference transistor coupled to the reference voltage generator and configured to receive the reference voltage from the reference voltage generator,
wherein the switching transistor and the reference transistor are coupled in series between the sensing circuit and the ground, and
wherein each of the plurality of reference current sub-circuits is configured to:

be turned on to generate the corresponding reference current if the switching transistor is switched on, and be turned off if the switching transistor is switched off.

12. The semiconductor device of claim 11, wherein the circuitry is configured to generate corresponding control signals for the switching transistors in the plurality of reference current sub-circuits based on the respective values of the corresponding option code, the corresponding control signals being configured to turn on one of the plurality of reference current sub-circuits for the set and to turn off one or more other ones of the plurality of reference current sub-circuits for one or more other sets of the plurality of sets.

13. The semiconductor device of claim 1, wherein each reference current is associated with a respective group of sets in the memory cell array, and
wherein threshold voltage distributions of memory cells in sets of a same group are within a predetermined range.

14. The semiconductor device of claim 1, further comprising a register configured to store the associations between the address information of the plurality of sets and the information associated with the different reference currents,
wherein the register is stored in at least one of the memory cell array or in the circuitry.

15. The semiconductor device of claim 1, wherein the semiconductor device is configured to be a three-dimensional (3 D) NOR flash memory, and a set of memory cells in the semiconductor device is a memory cell layer of memory cells.

16. A system, comprising:
a semiconductor device comprising:
a memory cell array configured to store data in sets of memory cells, wherein each set of a plurality of sets of memory cells in the memory cell array is associated with a respective reference current, and memory cells in sets associated with different reference currents have different threshold voltage distributions, and wherein associations between address information of the plurality of sets and information associated with the different reference currents are stored in the semiconductor device, and
circuitry coupled to the memory cell array; and
a controller coupled to the semiconductor device,
wherein the controller is configured to send a read command to the semiconductor device, the read command comprising address information of a set of memory cells in the memory cell array, and
wherein the circuitry of the semiconductor device is configured to:
determine information associated with a reference current for the set of memory cells in the memory cell array based on the address information of the set in the read command and a stored association between the address information of the set and the information associated with the reference current, the information associated with the reference current comprising a corresponding option code having respective values for the plurality of sets, the respective values of the corresponding option code indicating a selection of the set, among the plurality of sets, for generation of the reference current, a respective value for the set in the corresponding option code enabling the generation of the reference current for the set,
generate the reference current based on the respective value for the set in the corresponding option code of the information associated with the reference current for the set,
sense one or more memory cells in the set based on the reference current, and
send a sensing result of the one or more memory cells in the set to the controller.

17. The system of claim 16, wherein the circuitry of the semiconductor device comprises a sense amplifier coupled to the memory cell array,
wherein the sense amplifier comprises:
a reference current circuit coupled to a reference voltage generator and configured to receive a reference voltage from the reference voltage generator, and
a sensing circuit having a reference node coupled to the reference current circuit and a sensing node coupled to the memory cell array,
wherein the reference current circuit comprises a first node coupled to the reference node of the sensing circuit, a second node coupled to a ground, and a third node coupled to the reference voltage generator, and
wherein the reference current flows from the sensing circuit through the reference current circuit to the ground when the third node of the reference current circuit receives the reference voltage from the reference voltage generator.

18. The system of claim 17, wherein the reference current circuit comprises a transistor having a first terminal as the first node, a second terminal as the second node, and a gate terminal as the third node,
wherein the reference voltage generator is configured to generate the reference voltage based on the information associated with the reference current, and
wherein the reference current is generated based on the reference voltage and flows through the transistor.

19. The system of claim 17, wherein the reference current circuit comprises a plurality of reference current sub-circuits that are coupled in parallel between the sensing circuit and the ground,
wherein each of the plurality of reference current sub-circuits is configured to generate a corresponding reference current based on the reference voltage, corresponding reference currents generated by the plurality of reference current sub-circuits being different from each other, and
wherein the circuitry is configured to turn on one of the plurality of reference current sub-circuits and to turn off one or more other sub-circuits of the plurality of reference current sub-circuits based on the information associated with the reference current for the set, the reference current flowing through the one of the plurality of reference current sub-circuits and no reference current flowing through the one or more other sub-circuits of the plurality of reference current sub-circuits.

20. The system of claim 19, wherein
wherein the circuitry is configured to generate corresponding control signals for the plurality of reference current sub-circuits based on the respective values of the corresponding option code, the corresponding control signals being configured to turn on the one of the plurality of reference current sub-circuits and to turn off the one or more other ones of the plurality of reference current sub-circuits.

21. The system of claim 16, wherein each reference current is associated with a respective group of sets in the memory cell array, and threshold voltage distributions of memory cells in sets of a same group are within a predetermined range, and
  wherein the semiconductor device further comprises a register configured to store associations between reference currents and respective groups of sets.

22. A method, comprising:
  determining information associated with a reference current for a set of memory cells in a semiconductor device based on address information of the set, wherein each set of a plurality of sets of memory cells in the semiconductor device is associated with a respective reference current, and memory cells in sets associated with different reference currents have different threshold voltage distributions, wherein associations between address information of the plurality of sets and information associated with the different reference currents are stored in the semiconductor device, the information associated with the reference current comprising a corresponding option code having respective values for the plurality of sets, the respective values of the corresponding option code indicating a selection of the set, among the plurality of sets, for generation of the reference current, a respective value for the set in the corresponding option code enabling the generation of the reference current for the set;
  generating the reference current based on the respective value for the set in the corresponding option code of the information associated with the reference current for the set; and
  sensing one or more memory cells in the set based on the reference current.

* * * * *